(12) United States Patent
Amiram

(10) Patent No.: US 9,773,437 B2
(45) Date of Patent: Sep. 26, 2017

(54) MAGNETIC SUN VISOR FOR CAR WINDOW

(71) Applicant: David Amiram, Sherman Oaks, CA (US)

(72) Inventor: David Amiram, Sherman Oaks, CA (US)

( * ) Notice: Subject to any disclaimer, the term of this patent is extended or adjusted under 35 U.S.C. 154(b) by 0 days.

(21) Appl. No.: 15/374,851

(22) Filed: Dec. 9, 2016

(65) Prior Publication Data

US 2017/0169744 A1 Jun. 15, 2017

Related U.S. Application Data

(60) Provisional application No. 62/265,361, filed on Dec. 9, 2015.

(51) Int. Cl.
| | | |
|---|---|---|
| *G09F 21/04* | (2006.01) | |
| *B60J 3/02* | (2006.01) | |
| *G09F 13/22* | (2006.01) | |
| *H01L 31/147* | (2006.01) | |
| *H02S 30/20* | (2014.01) | |

(52) U.S. Cl.
CPC ............ *G09F 21/04* (2013.01); *B60J 3/0213* (2013.01); *B60J 3/0278* (2013.01); *B60J 3/0286* (2013.01); *G09F 13/22* (2013.01); *H01L 31/147* (2013.01); *H02S 30/20* (2014.12); *G09F 2013/222* (2013.01)

(58) Field of Classification Search
CPC ....... B60J 3/0213; B60J 3/0278; B60J 1/2091
See application file for complete search history.

(56) References Cited

U.S. PATENT DOCUMENTS

| | | | | |
|---|---|---|---|---|
| 4,932,711 A * | 6/1990 | Goebel | ................... | B60J 1/2091 160/370.23 |
| 4,944,548 A * | 7/1990 | Payne | .................... | B60J 1/2091 160/370.23 |
| 5,044,686 A * | 9/1991 | Acenbrack | ............. | B60J 1/2091 160/32 |
| 5,158,127 A * | 10/1992 | Schumacher | .......... | B60J 1/2091 160/368.1 |
| 5,165,748 A * | 11/1992 | O'Connor | .............. | B60J 3/0208 160/370.23 |
| 5,170,830 A * | 12/1992 | Coslett | .................... | B60J 1/2091 160/192 |
| 5,314,226 A * | 5/1994 | Tovar | ..................... | B60J 1/2091 160/370.21 |
| 5,535,808 A * | 7/1996 | Idesis | ..................... | B60J 1/2011 160/238 |
| 5,882,059 A * | 3/1999 | Romero | .................. | B60J 3/0208 296/97.6 |
| 6,976,523 B2 * | 12/2005 | Huang | .................... | B60J 1/2091 160/368.1 |
| 7,718,923 B1 * | 5/2010 | Hansen | .................. | B60J 1/2094 160/370.21 |
| 8,556,328 B1 * | 10/2013 | Middleton | ............. | B60J 1/2047 160/23.1 |

(Continued)

*Primary Examiner* — Gary C Hoge

(57) ABSTRACT

A sun visor for a motor vehicle having a main body portion with an LED display for advertising. The sun visor has a foldable, expandable shade portion extending from the main body portion to block sunlight. The sun visor has magnetic portions at a top of the main body portion to allow for easy attachment and detachment to an inside of a car window frame.

5 Claims, 3 Drawing Sheets

(56) References Cited

U.S. PATENT DOCUMENTS

| | | | |
|---|---|---|---|
| 8,845,002 B1 * | 9/2014 | Desphande | B60J 3/0247 296/97.7 |
| 2008/0110067 A1 * | 5/2008 | Smith | G09F 13/00 40/541 |
| 2013/0011583 A1 * | 1/2013 | Knauer | B60J 1/2091 428/12 |

* cited by examiner

MAGNETIC SUN VISOR FOR CAR WINDOW

CROSS REFERENCE TO RELATED APPLICATION

This application claims priority to U.S. Provisional Application No. 62/265,361, filed Dec. 9, 2015, which is hereby incorporated by reference in its entirety as if fully recited herein.

BACKGROUND OF THE INVENTION

The present invention generally relates to a sun visor, more particularly to sun visor with magnetic elements so that the sun visor may be affixed to a frame of a car window. The sun visor also includes an illuminating LED panel to allow for advertising, for example. The sun visor is foldable and expandable for easy use and storage.

Drivers and passengers of motor vehicles alike often require and use sun visors to block blinding sun and heat while in the vehicle. Traditional sun visors are built into a car's interior and can be lowered in front of the driver or passenger to block front-entering sun. Some of these visors can be released and turned upon a hinge toward a side window to block entry of sunlight shining through the side window. However, since these visors are designed to be used during driving, they have limited size and are not very effective for limiting sun entering the vehicle resulting in excessive vehicle heating.

Various sun shades that can cover an entire front windshield or side windows to block sun while a car is parked are also known in the art. However, these sun shades are bulky and generally serve one function only, namely to block sun.

SUMMARY OF THE INVENTION

The present invention provides a multi-purpose, foldable sun visor that can be magnetically attached to the frame of a car window to provide protection from the sun, but also has an LED panel to display advertising, designs, etc., during use of the sun visor.

BRIEF DESCRIPTION OF THE DRAWINGS

A more complete understanding of the present invention may be obtained with reference to the Detailed Description when taken in conjunction with the accompanying Drawings.

DETAILED DESCRIPTION OF THE INVENTION

Figure 1A:
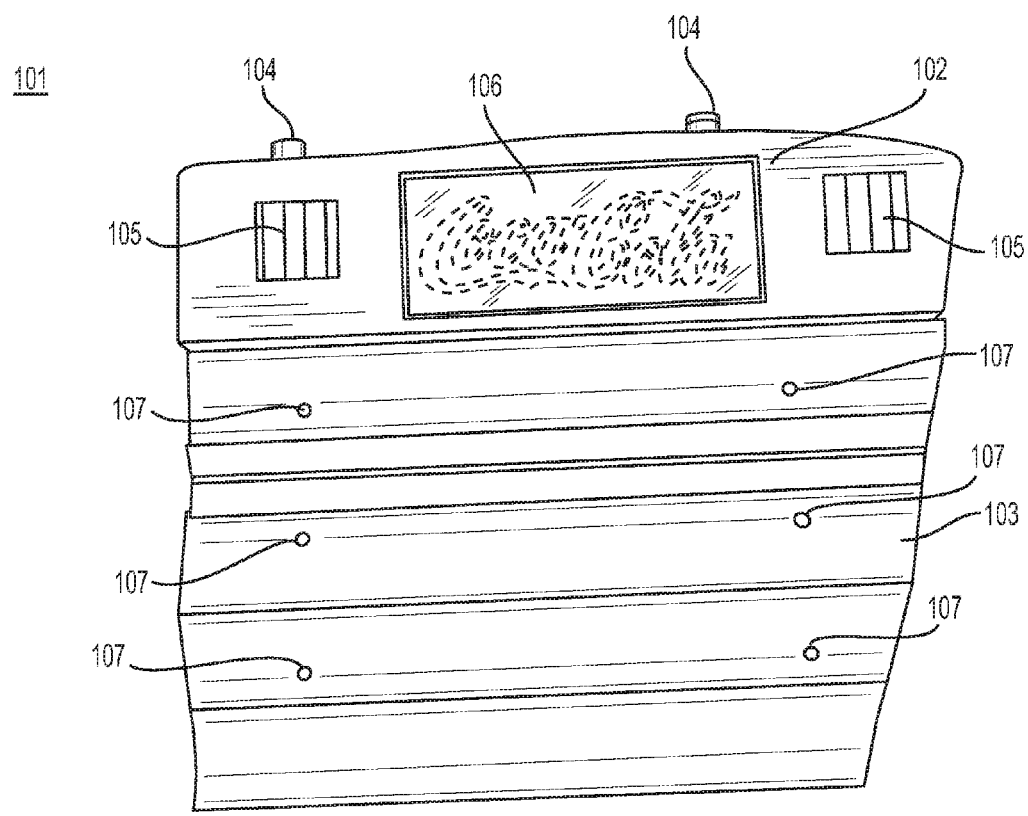
FIG. 1A is a perspective view of the sun visor in an expanded state in accordance with one aspect of the invention.

Referring now to FIG. 1A, a perspective view of the sun visor 101 is shown. Sun visor 101 has a main body portion 102 and an expandable shade portion 103. Main body portion 102 has magnetic portions 104 at a top portion of the main body portion 102. These magnetic portions 104 can have varying shapes and sizes, but would have a magnetic strength strong enough to hold the total weight of sun visor 101 and still be readily removed by a user.

Main body portion 102 also has at least one solar panel 105 to absorb light and covert the light into energy to power LED panel 106. LED panel 106 can be etched with various ads or designs for advertising or aesthetic purposes. The etched portions can then light up and be visible even when dark.

Expandable shade portion 103 comprises a number of folding portions, which can fold upon each other in a fan-like matter. Found on each folding portion are magnets 107, which hold the folding portions together when in a folded state as shown in FIG. 1B.

Figure 1B:
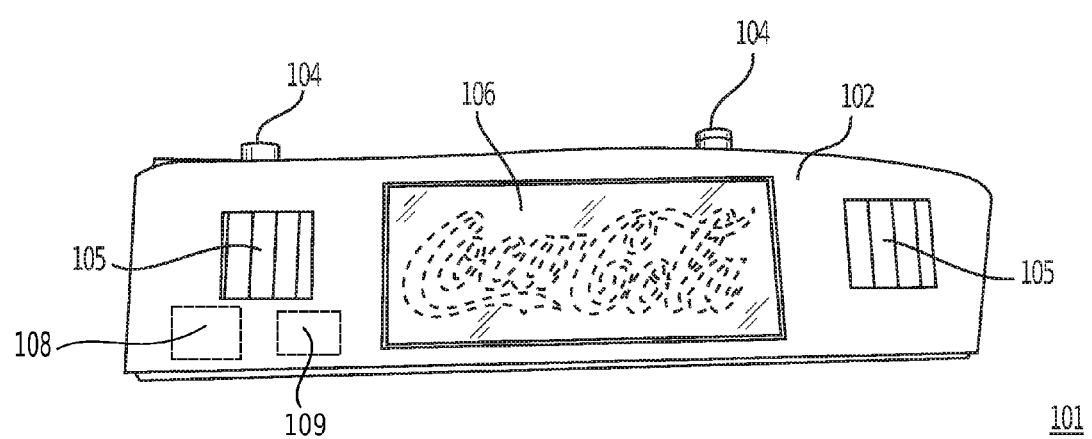
FIG. 1B is a perspective view of the sun visor of FIG. 1A in a folded state.

Turning now to FIG. 1B, sun visor 101 is shown in a folded state. As can be seen from this figure, when the folding portions of expandable shade portion 103 (as seen in FIG. 1A) are folded upon each other, sun visor 101 is compact and sized the same the main body portion 102. Magnets 107 (seen in FIG. 1A) can be used to keep the folding portions of the expandable shade portion 103 together in a folded state. In this compact state, sun visor 101 can be easily transported and/or stored by a user. Main body portion 102 has a receiver 108 for receiving messages and a processor 109 for processing messages received through the receiver 108.

Figure 2:
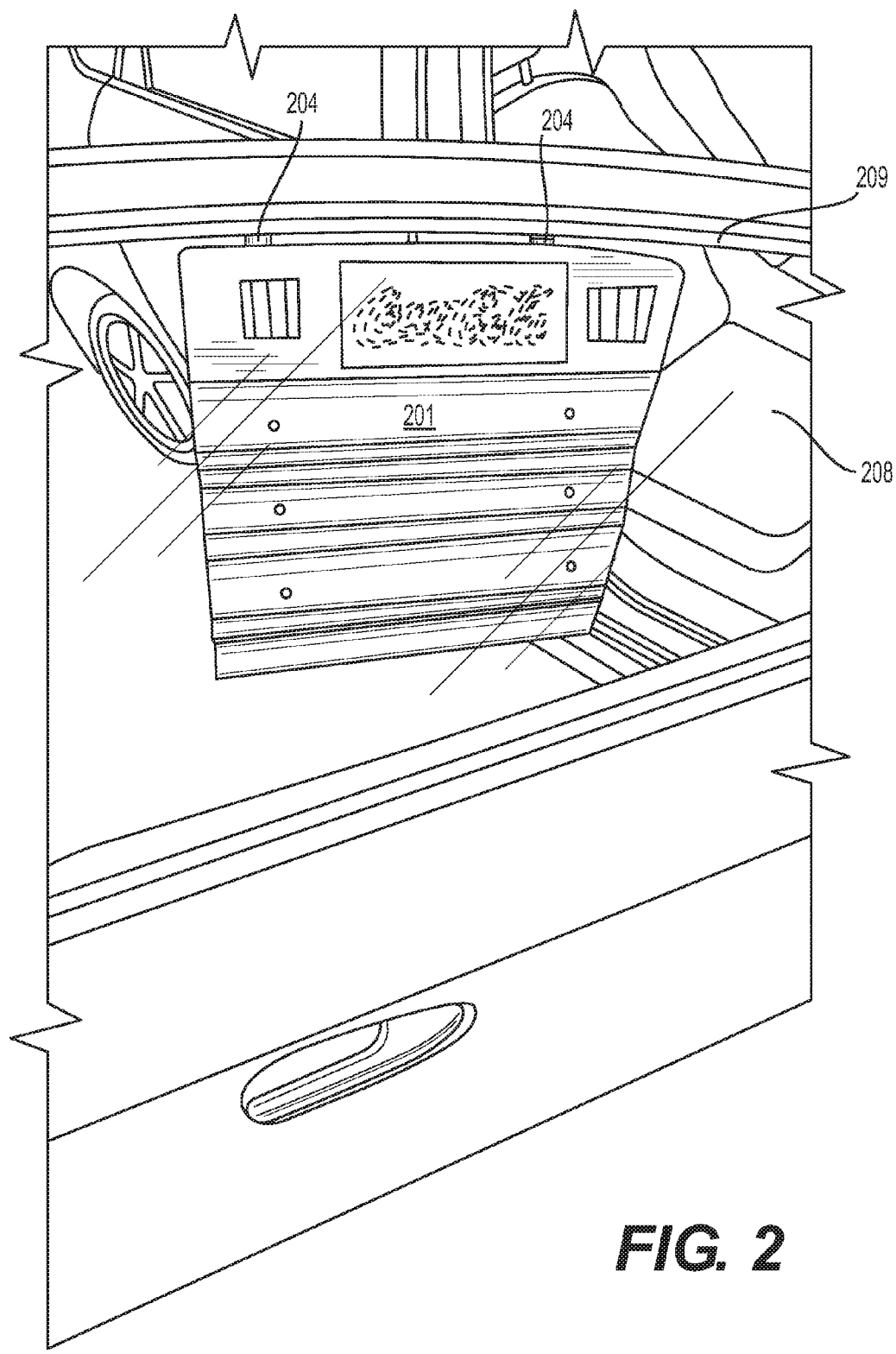
FIG. 2 is a perspective view of the sun visor of FIGS. 1A and 1B in an expanded state and in use on a car window.

FIG. 2 shows an exemplary sun visor in use on the frame of a car window. As can be seen from the figure, sun visor 201 can attach to the frame 209 of the car window 208 via magnets 204. Sun visor 201 generally has the same features shown in sun visor 101 of FIGS. 1A and 1B and, therefore, not repeated herein.

Sun visor 101 can be of varying shapes and sizes but generally limited to the size of a car window. In certain embodiments, the shape of sun visor 101 can mimic or track the shape of the car window, for example, have either straight or curved edges. Sun visor 101 can be made of a variety of materials including, but not limited to, plastics, for example.

In lieu of the solar panel/LED panel combination, phosphorescent paint (i.e., glow-in-the-dark paint) or other luminous material can be used for depicting advertising and/or other decorative designs. Phosphorescent paint has the ability to emit light after exposure to light; accordingly, the advertising and/or other decorative designs would be visible at night without the need of energy from sources such as from a solar panel.

In an alternate embodiment, the main body portion 102 further comprises a receiver, which can receive messages via satellite, radio or cellular signals from an advertiser over a control or satellite channel or the like. These messages received by the receiver can then be processed by a processor and the message data is displayed on the LED panel 106. As such, an advertiser can control and change the advertisement on the LED panel 106 as desired.

While the foregoing written description of the invention enables one of ordinary skill in the art to make and use the invention, those of ordinary skill in the art will understand and appreciate the existence of variations, combination, and equivalents of the embodiments, methods, and examples provided herein. The invention should, therefore, not be limited by the embodiments and examples disclosed here, but by all embodiments and methods within the scope and spirit of the invention as claimed.

The invention claimed is:
1. A sun visor comprising:
a main body portion;
a foldable, expandable shade portion extending from said main body portion comprising a plurality of folding sections that can fold onto each other;
said main portion having at least one LED panel and at least one solar panel for powering said LED panel; and
said main portion having at least one magnet at a top of said main portion designed to magnetically attach to a frame of a car window;

wherein each of said plurality of folding sections has at least one magnet, which plurality of folding sections can be folded onto each other and held together using said magnets.

2. The sun visor of claim 1, wherein said main body portion has a receiver for receiving messages from an advertiser.

3. The sun visor of claim 2, wherein said main body portion has a processor for processing said messages received through said receiver.

4. The sun visor of claim 3, wherein the received messages are displayed on said at least one LED panel.

5. A sun visor comprising:
- a main body portion;
- a foldable, expandable shade portion extending from said main body portion comprising a plurality of folding sections that can fold onto each other;
- said main portion having at least one LED panel and at least one solar panel for powering said LED panel;
- said main portion having at least one magnet at a top of said main portion designed to magnetically attach to a frame of a car window;

each of said plurality of folding sections having at least one magnet, which plurality of folding sections can be folded onto each other and held together using said magnets; and
- said main body portion having a receiver for receiving messages from an advertiser and a processor for processing said messages received through said receiver;
- wherein the received messages are displayed on said at least one LED panel.

\* \* \* \* \*